United States Patent
Parkhurst et al.

(10) Patent No.: US 12,474,421 B2
(45) Date of Patent: Nov. 18, 2025

(54) HALL EFFECT SENSOR WITH REDUCED JFET EFFECT

(71) Applicant: Texas Instruments Incorporated, Dallas, TX (US)

(72) Inventors: Charles Parkhurst, Murphy, TX (US); Gabriel Eugenio De La Cruz Hernandez, Richardson, TX (US); Keith Ryan Green, Prosper, TX (US); Dimitar Trifonov, Vail, AZ (US); Chao-Hsuian Tsay, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 913 days.

(21) Appl. No.: 17/402,019

(22) Filed: Aug. 13, 2021

(65) Prior Publication Data

US 2023/0048022 A1    Feb. 16, 2023

(51) Int. Cl.
*G01R 33/07* (2006.01)
*H10N 52/00* (2023.01)
*H10N 52/80* (2023.01)

(52) U.S. Cl.
CPC ......... *G01R 33/072* (2013.01); *H10N 52/101* (2023.02); *H10N 52/80* (2023.02)

(58) Field of Classification Search
CPC .. G01R 33/072; G01R 33/075; G01R 33/077; G01R 33/0023; G01R 33/07; G01R 33/0041; G01R 33/0052; G01R 33/007; H10N 52/80; H10N 52/101; H10N 59/00
See application file for complete search history.

(56) References Cited

U.S. PATENT DOCUMENTS

| | | | |
|---|---|---|---|
| 4,929,993 A | * | 5/1990 | Popovic ............... H10N 52/101 257/E27.005 |
| 5,106,777 A | | 4/1992 | Rodder |
| 5,468,676 A | | 11/1995 | Madan |

(Continued)

OTHER PUBLICATIONS

Liu et al., "Offset error reduction in Open Loop Hall Effect current sensors powered with single voltage source," Int'l Workshop on Applied Measurements for Power Systems Proceedings (IEEE, 2014), pp. 1-6.

(Continued)

*Primary Examiner* — Latanya N Crawford Eason
(74) *Attorney, Agent, or Firm* — Mandy Barsilai Fernandez; Frank D. Cimino

(57) ABSTRACT

A Hall effect sensor including a Hall element disposed at a surface of a semiconductor body, including a first doped region of a first conductivity type disposed over and abutted by an isolated second doped region of a second conductivity type. First through fourth terminals of the Hall element are in electrical contact with the first doped region, and a fifth terminal in electrical contact with the second doped region. A Hall effect sensor includes a first current source coupled to the first terminal of the Hall element, and common mode feedback regulation circuitry. The common mode feedback regulation circuitry has an output coupled to the third terminal and a ground node, and having an input coupled to the second and fourth terminals of the Hall element, and an output coupled to the third terminal and a ground node, where the second doped region is coupled to the third terminal.

20 Claims, 9 Drawing Sheets

(56) References Cited

U.S. PATENT DOCUMENTS

| | | | |
|---|---|---|---|
| 6,064,202 A | 5/2000 | Steiner et al. | |
| 6,667,226 B2 | 12/2003 | Pinto et al. | |
| 9,013,167 B2 | 4/2015 | Antonacci et al. | |
| 9,076,863 B2 | 7/2015 | Tamura et al. | |
| 9,728,581 B2 | 8/2017 | Green et al. | |
| 10,553,784 B2 | 2/2020 | Green et al. | |
| 2009/0206424 A1* | 8/2009 | Kilian | H10B 61/00 |
| | | | 257/E29.323 |
| 2016/0268498 A1* | 9/2016 | Eckinger | H10N 52/01 |
| 2020/0006549 A1 | 1/2020 | Sadovnikov et al. | |

OTHER PUBLICATIONS

Akka et al., "Design of a portable, two dimensional magnetometer, using 2 dimensional quantum Hall effect sensor array, optimised for low magnetic field applications," Int'l Symp. on Electron Devices for Microwave and Optoelectronic Applications (IEEE, 2002), pp. 177-182.

Danil et al., "Low field Hall effect magnetometry," J. Appl. Phys., vol. 53 (1982), pp. 8257-8259.

Frounchi et al., "Integrated Hall Sensor Array Microsystem," Paper 16.3, 2001 IEEE Int'l Solid State Circ.Conf. (IEEE, 2001), pp.

TMAG511x 2D, Dual-Channel, High-Sensitivity, Hall-Effect Latch, Datasheet TMAG5110, 5111 (Texas Instruments Incorporated, 2021).

TMAG5123 In-Plane, High-Precision, High-Voltage, Hall-Effect Switch, Datasheet TMAG5123 (Texas Instruments Incorporated, 2021).

TMAG5124 2-Wire, High-Precision, Hall-Effect Switch Sensor, Datasheet TMAG5124 (Texas Instruments Incorporated, 2021).

TMCS1101 1.5% Precision, Basic Isolation Hall-Effect Current Sensor With +/−600-V Working Voltage, Datasheet TMCS1101 (Texas Instruments Incorporated, 2021).

\* cited by examiner

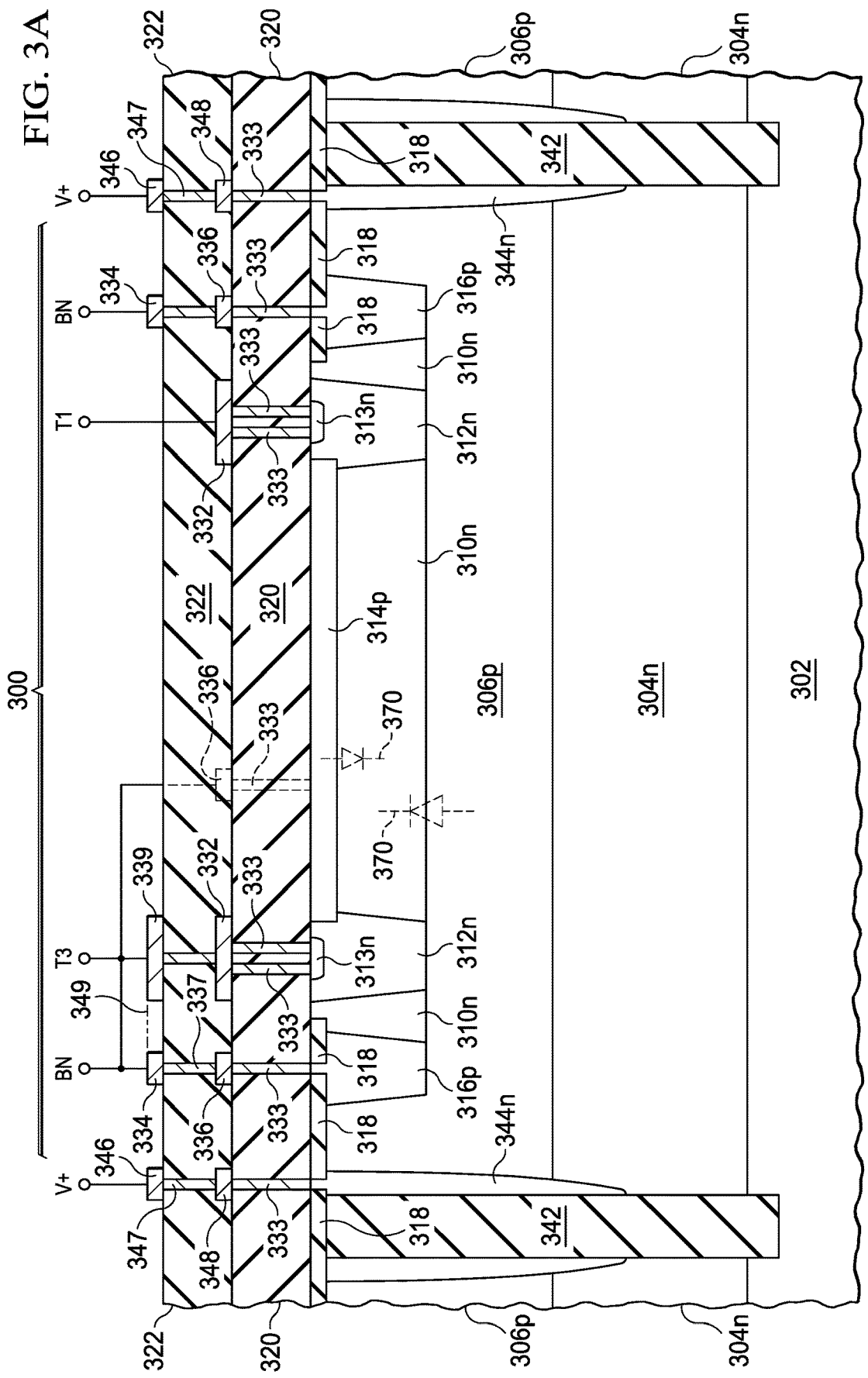

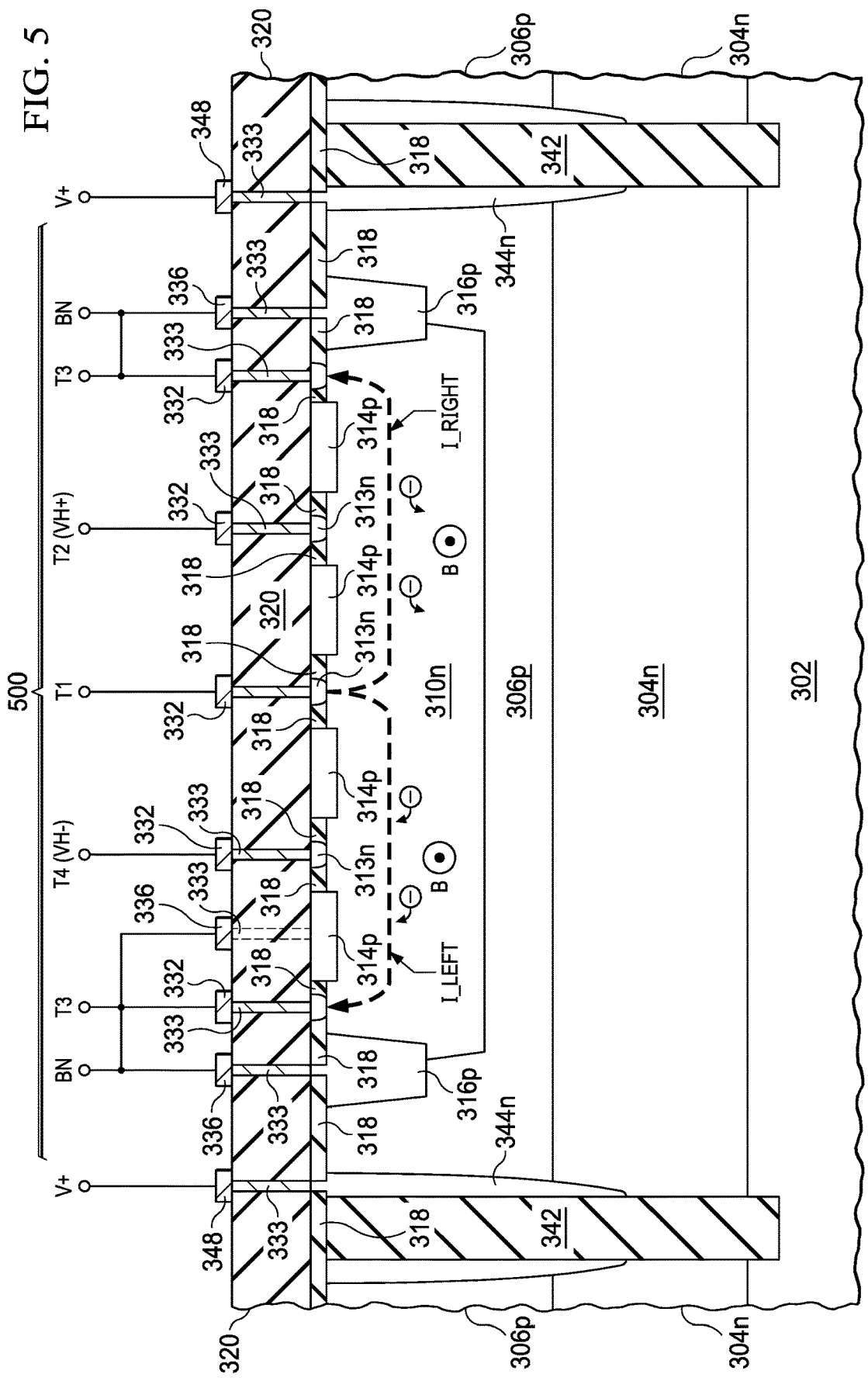

HALL EFFECT SENSOR WITH REDUCED JFET EFFECT

CROSS-REFERENCE TO RELATED APPLICATIONS

Not applicable.

BACKGROUND

This relates to magnetic field sensors based on the Hall effect and is more specifically directed to such sensors as realized in an integrated circuit structure.

In the operation and control of many modern electronic systems, it is useful to sense the presence, and in some cases the magnitude, of a magnetic field. Magnetic field sensing serves as the basis for the measurement of electrical current, such as in motor systems, energy distribution systems, appliances, power delivery, and the like. Magnetic field sensing is also often applied in position or proximity sensing, such as in industrial, security, and other mechanical applications. Hall effect sensors may also be used to detect movement of an object relative to another object (e.g., the opening of a cover to an enclosed case where the cover or case includes a magnet that induces a current in a coil included in the case or cover, respectively, when the cover is opened).

A popular class of magnetic field sensors is based on the well-known Hall effect. FIG. 1 illustrates an example of a conventional Hall effect sensor 110. Sensor 110 includes Hall element 100 constructed as a semiconductor material, for example single-crystal silicon doped with p-type or n-type impurities to a selected conductivity. Sensor 110 includes current source 120 biased by voltage reference circuit 122 to a voltage based on external voltage VS. Current source 120 applies a bias current I_BIAS to terminal T1 of Hall element 100. Hall element 100 conducts this bias current I_BIAS toward its terminal T3, from which current source 126 conducts a return current I_RET to ground. In the presence of a magnetic field orthogonal to the direction of current through Hall element 100, in this example into or out of the page of FIG. 1, the Lorentz force acts on the majority carriers in the semiconductor material of Hall element 100 (e.g., electrons in n-type silicon) to produce a "Hall voltage," namely the differential of voltages VH+ and VH− at terminals T2 and T4, respectively.

Terminals T2 and T4 are coupled to inputs of differential amplifier 140, which amplifies the typically small differential Hall voltage at those terminals. The amplified Hall voltage at the output of amplifier 140, in the form of an analog signal indicative of the strength of the magnetic field, is applied in this conventional example to an input of output driver 142, configured as a Schmitt trigger for example. Amplifier 140 and output driver 142 may be biased from reference voltage generator 122. Output driver 142 drives the base of open collector bipolar transistor 160 to produce a binary signal at output node OUT in response to the analog signal at the output of amplifier 140. For example, the binary output signal may be indicative of whether the Hall element 100 is in the presence of a magnetic field greater than some threshold level.

As fundamental in the art, the resistance of the semiconductor material of Hall element 100 increases with increasing temperature. In Hall effect sensor 110, this increased resistance can affect the voltage at terminals T2, T4 of Hall element 100 for a given fixed bias current I_BIAS, resulting in a temperature-dependent drift of the Hall voltage. Both temperature and manufacturing variations can also cause offset (e.g., a differential voltage in the absence of a magnetic field) at amplifier 140.

To counteract this drift and offset, conventional Hall effect sensor 110 includes a common mode feedback circuit to regulate the return current I_RET conducted by current source 126 from terminal T3 of Hall element 100. This common mode feedback circuit includes amplifier 150, which receives a common mode reference voltage VCM generated by reference voltage circuit 152 at a negative input. Amplifier 150 has one positive input coupled to terminal T2 to receive voltage VH+, and another positive input coupled to terminal T4 to receive voltage VH−. Amplifier 150 in this conventional arrangement is configured to produce an output signal corresponding to the difference between the common mode voltage of terminals T2 and T4 (e.g., the average of voltages VH+ and VH−) and common mode reference voltage VCM from reference voltage circuit 152. This output signal is applied as a control signal to current source 126 (e.g., a gate voltage for the case in which current source 126 is realized as a metal-oxide-semiconductor (MOS) transistor). This arrangement results in amplifier 150 regulating return current I_RET through current source 126 so that the common mode voltage at terminals T2 and T4 matches common mode reference voltage VCM, regardless of manufacturing and temperature variations in Hall effect sensor 110. Drift and offset can thus be reduced.

Commonly assigned U.S. Pat. No. 9,013,167, incorporated herein by reference, describes another common mode feedback approach applied to a Hall effect sensor. As described in this U.S. Patent No. 9,013,167, its common mode feedback regulator regulates the voltages at the bias terminals of the Hall element (e.g., terminals T1, T2) so that the average or midpoint of the bias voltages matches the average or midpoint of the Hall voltages VH+, VH−. This common mode feedback regulation approach is described as also reducing drift and offset in Hall effect sensors.

By way of further background, Hall effect sensors are commonly realized in integrated circuits along with other functions. Examples of such Hall effect sensor integrated circuits include the TMCS1100 and TMCS1101 Hall effect current sensors available from Texas Instruments Incorporated.

It is within this context that the embodiments described herein arise.

BRIEF SUMMARY OF THE INVENTION

According to one aspect, a Hall effect sensor includes a Hall element disposed at a surface of a semiconductor body. The Hall element is constructed to include a first doped region of a first conductivity type, disposed over and abutted by a second doped region of a second conductivity type. The Hall element is constructed so that the second doped region is electrically isolated within the semiconductor body. First, second, third, and fourth terminals of the Hall element are in electrical contact with the first doped region at separate locations of the surface, and a fifth terminal in electrical contact with the second doped region. The Hall element is arranged into a Hall effect sensor that includes a first current source coupled to the first terminal of the Hall element, output circuitry coupled to the second and fourth terminals of the Hall element, and common mode feedback regulation circuitry. The common mode feedback regulation circuitry has an output coupled to the third terminal and a ground node, and having an input coupled to the second and fourth terminals of the Hall element, and an output coupled to the third terminal and a ground node. The second doped region is coupled to the third terminal of the Hall element.

According to another aspect, a method of detecting a magnetic field at an integrated circuit includes biasing, with a current, a first terminal of a Hall element disposed at a surface of the integrated circuit and in contact with a first doped region of a first conductivity type. The method further includes regulating a voltage at a third terminal of the Hall element responsive to a common mode voltage at second and fourth terminals of the Hall element and amplifying a differential voltage at the second and fourth terminals to produce an output signal responsive to a magnetic field impinging the Hall element. According to this aspect, the Hall element includes a second doped region of a second conductivity type underlying and abutting the first doped region. This second doped region is coupled to the third terminal and has a voltage regulated with the voltage at the third terminal.

Technical advantages enabled by one or more of these aspects include reducing variation in the magnetic gain and offset of an integrated Hall effect sensor over variations in temperature and manufacturing parameters. These technical advantages are available for both horizontal and vertical Hall elements.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

FIG. 3A is a cross-sectional diagram of an integrated circuit structure including a Hall element constructed according to an example embodiment.

FIG. 5 is a cross-sectional diagram of an integrated circuit structure including a vertical Hall element constructed according to an example embodiment.

The same reference numbers or other reference designators are used in the drawings to illustrate the same or similar (in function and/or structure) features.

DETAILED DESCRIPTION OF THE INVENTION

One or more embodiments are described in this specification as implemented into Hall effect sensors that may be integrated into larger scale integrated circuits, as it is contemplated that such implementation is particularly advantageous in that context. However, it is also contemplated that aspects of these embodiments may be beneficially applied in other applications, and in a variety of Hall effect sensor arrangements and integrated circuit structures. Accordingly, it is to be understood that the following description is provided by way of example only and is not intended to limit the true scope of this invention as claimed.

Figure 1:
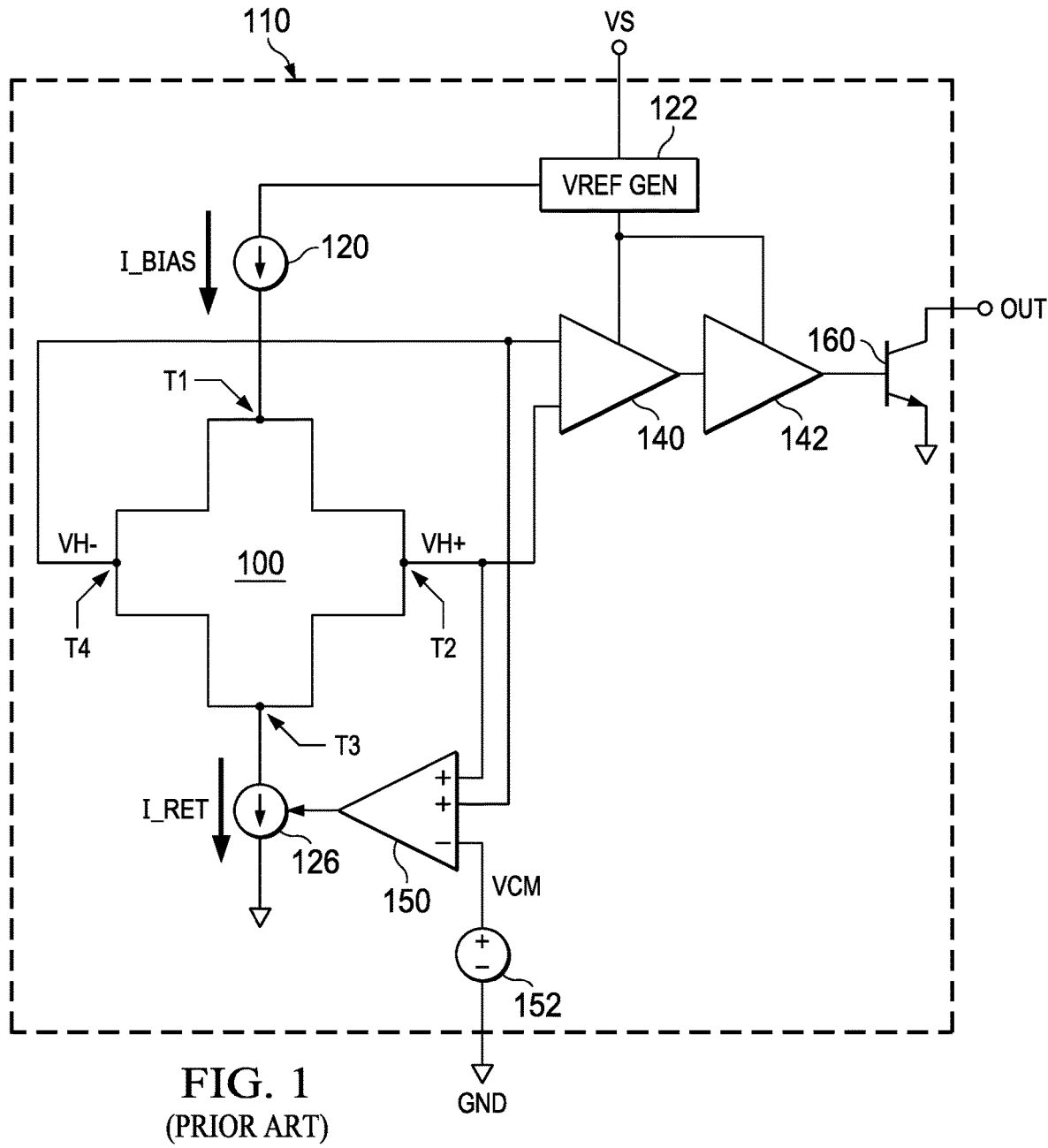
FIG. 1 is an electrical diagram, in schematic form, of a conventional Hall effect sensor.

As described above in connection with the conventional Hall effect sensor of FIG. 1, common mode feedback regulation can provide important stability of the sensor over changes in temperature. However, it has been discovered, in connection with one or more embodiments, that the implementation of this type of conventional Hall effect sensor in certain integrated circuit technologies can give rise to an additional instability in the sensor output over temperature, as will now be described with reference to FIGS. 2A through 2D.

Figure 2A:
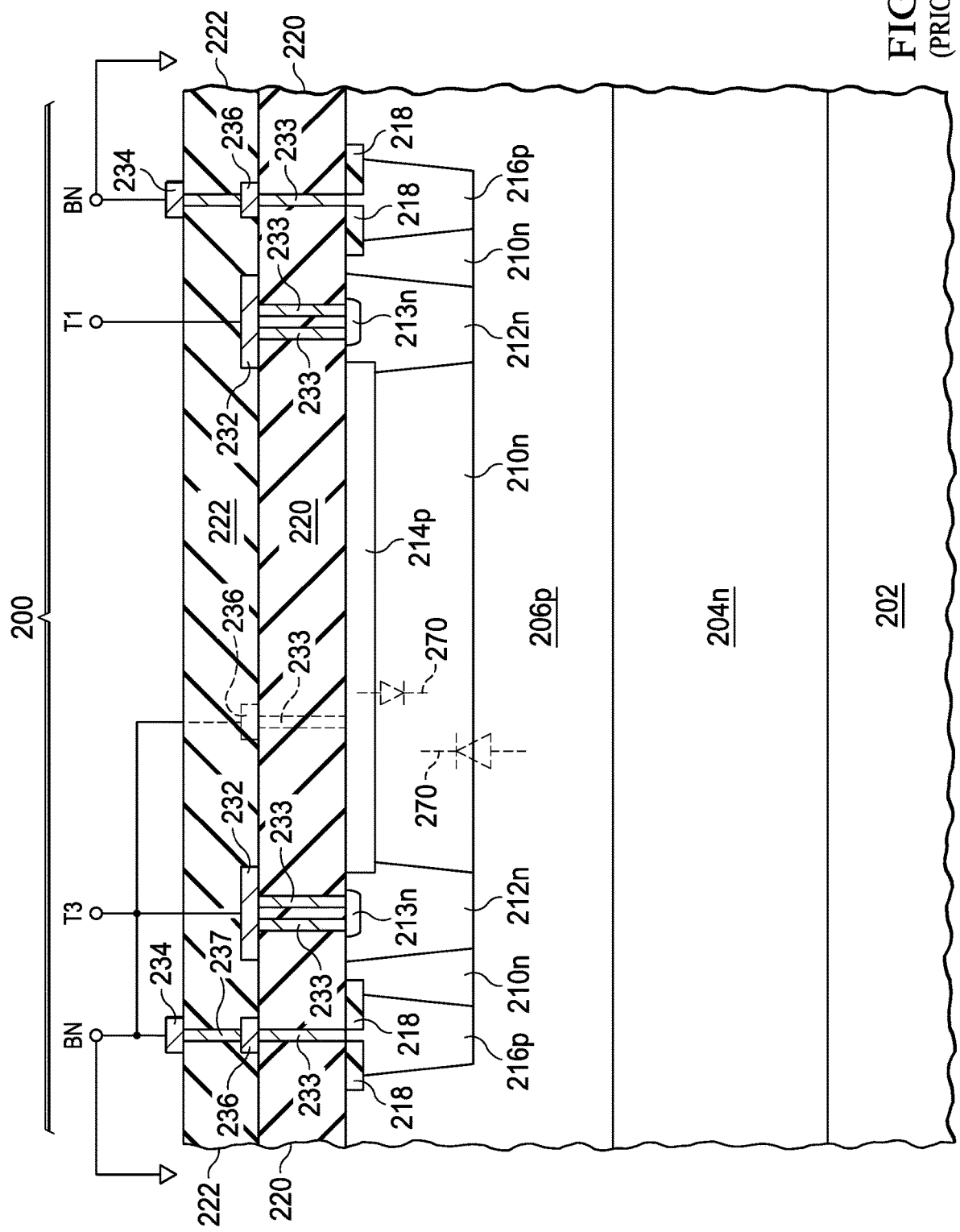
FIG. 2A is a cross-sectional diagram of a conventional integrated circuit structure including a Hall element.
Figure 2B:
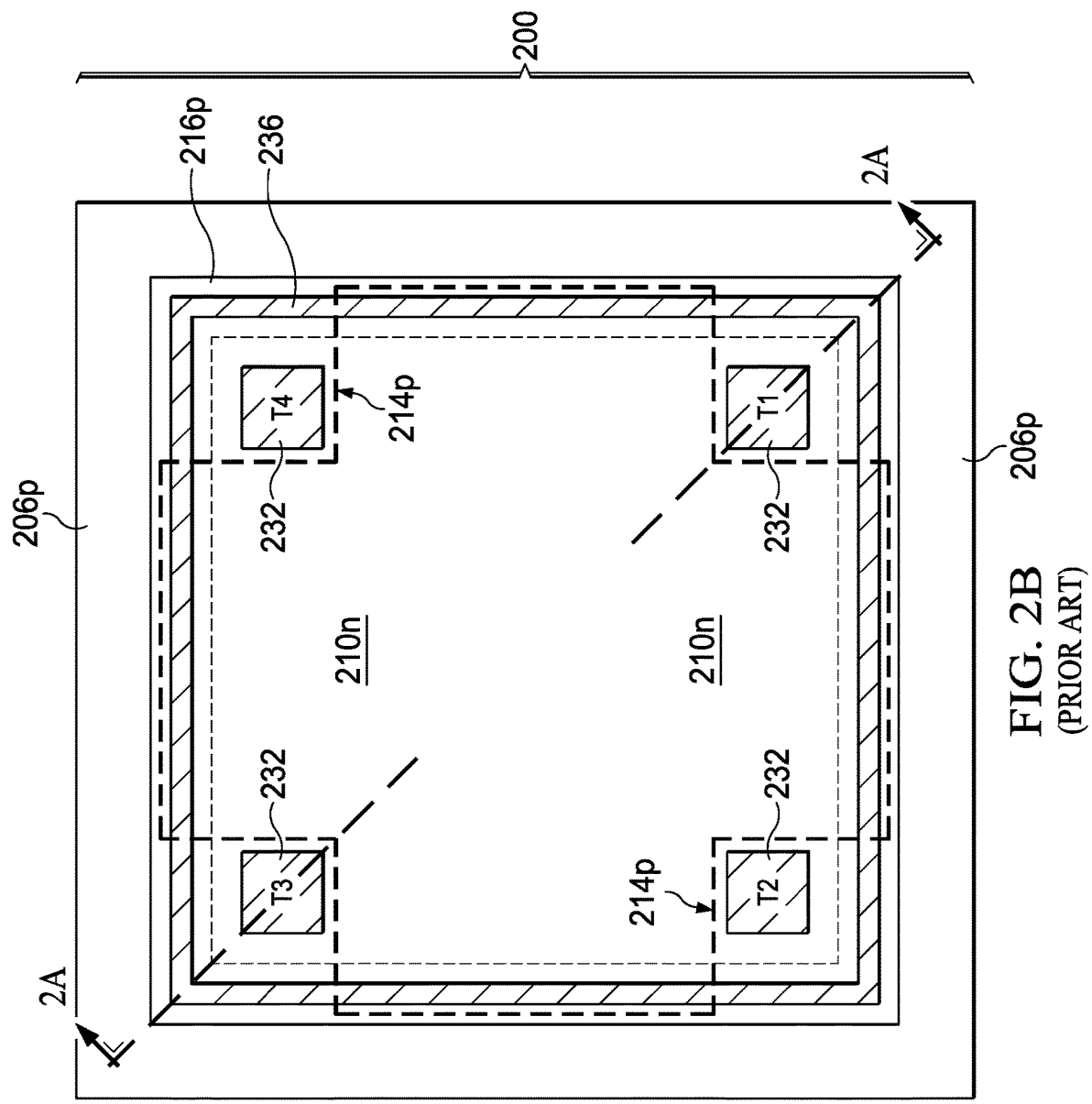
FIG. 2B is a plan view diagram of the conventional integrated circuit structure of FIG. 2A.

FIG. 2A and FIG. 2B illustrate in cross-section and plan view, respectively, an integrated circuit including a Hall effect sensor according to a conventional implementation such as that described above relative to FIG. 1. In this conventional example, as shown in cross-section by FIG. 2A, Hall element 200 is constructed at a surface of a body of semiconductor (e.g., silicon) material. In this example, the semiconductor body includes substrate 202, which may be doped p-type, p-type layer 206$p$ disposed at a surface of substrate 202, and n-type buried layer 204$n$ disposed between substrate 202 and p-type layer 206$p$. N-type well 210$n$ is disposed at selected locations of the surface of p-type epitaxial layer 206$p$ to serve as the active layer for Hall element 200, and may be lightly doped relative to n-type buried layer 204$n$ in many implementations. P+ layer 214$p$ is disposed at a surface of n-type well 210$n$ in Hall element 200, and in this conventional example, may have a relatively heavy dopant concentration such as that of source and drain regions of p-channel MOS transistors elsewhere in the integrated circuit.

Shallow n-type wells 212$n$ are disposed at selected locations within n-type well 210$n$. N+ regions 213$n$ are disposed at locations of the surface of shallow n-type wells 212$n$ for contact with overlying metal conductors. One or more shallow p-type wells 216$p$ are disposed along the boundary of n-type well 210$n$. In this conventional example, shallow trench isolation structures 218 are disposed at the surface of shallow p-type wells 216$p$.

One or more insulating layers 220, 222 are disposed over the surface of the structure and are comprised of silicon dioxide, silicon nitride, or another insulating material. Electrical connection to various structures of Hall element 200 is made through these overlying insulating layers 220, 222. As shown in FIG. 2A, metal conductors 232 are disposed at the surface of lower insulating layer 220. Metal conductors 232 electrically contact corresponding instances of shallow n-well 212$n$ by way of contacts 233 extending through insulating layer 220 to n+ regions 213$n$ at the surface of shallow n-well instances 212$n$. Similarly, electrical contact to shallow p-well 216$p$ is made from metal conductors 234 at the surface of upper insulating layer 222, through corresponding vias 237 to metal conductors 236 and contacts 233 through insulating layer 220 to shallow p-wells 216$p$. The locations of contacts 233 at the surface of shallow p-wells 216$p$ are between shallow isolation structures 218 as shown in FIG. 2A, at which p+ regions (not shown) may be present if desired.

FIG. 2B illustrates conventional Hall element 200 in plan view, at a point in its fabrication before the deposition of insulating layer 222, and with insulating layer 220 not visible for clarity. As evident from FIG. 2B, Hall element 200 has a square shape, with conductors 232 disposed near its four corners. The cross-section of FIG. 2A is taken across a diagonal through two of metal conductors 232, namely those corresponding to terminals T1 and T3 of the sensor. In this example of FIG. 2B metal conductor 236 and shallow p-type well 216p encircles n-type well 210n, with multiple contacts 233 extending through insulating layer 220 to contact shallow p-type well 216p at locations under metal conductor 236. As evident from FIG. 2B (as well as FIG. 2A), p-type layer 206p surrounds n-type well 210n.

P+ layer 214p, illustrated by dashed lines in FIG. 2B, extends over much of the surface of n-type well 210n and overlaps shallow p-type well 216p. Metal conductor 236 may overlap p+ layer 214p at shallow p-type well 216p, and at those locations contacts 233 from metal conductor 236 to p+ layer 214p may be made through insulating layer 220, typically at multiple locations.

Figure 2C:
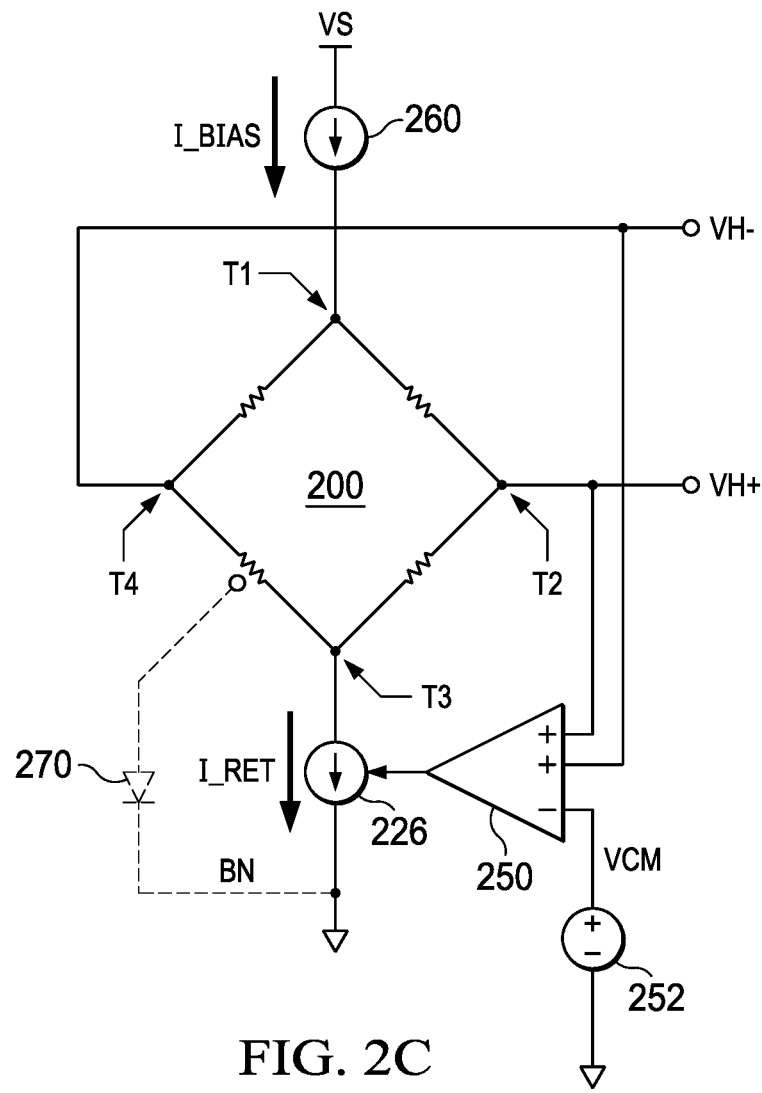
FIG. 2C is an electrical diagram, in schematic form, of a conventional Hall effect sensor incorporating the conventional Hall element of FIG. 2A and FIG. 2B.

FIG. 2C illustrates the electrical arrangement of Hall element 200 according to the structure of FIG. 2A and FIG. 2B into a Hall effect sensor according to the circuit arrangement of FIG. 1. In the electrical schematic of FIG. 2C, Hall element 200 is represented by an equivalent circuit of a Wheatstone bridge with four resistors arranged among four terminals T1 through T4, each corresponding to one of the four metal conductors 232 of FIG. 2B. The cross-sectional view of FIG. 2A is taken through the metal conductors 232 corresponding to the terminals T1, T3. Metal conductors 232 for terminals T2 and T4, at which the Hall voltages VH+ and VH− respectively appear, are not visible in the cross-sectional view of FIG. 2A but are shown in FIG. 2B. Hall element 200 of FIG. 2A and FIG. 2B is oriented to sense a magnetic field in the direction normal to the surface of the integrated circuit, with terminals T2, T4 disposed such that the Hall voltage resulting from the Lorentz force is orthogonal to the cross-section of FIG. 2A (i.e., running into and out of the page).

The Hall effect sensor circuit shown in FIG. 2C operates in the conventional manner described above relative to FIG. 1, with current source 260 applying bias current I_BIAS to Hall element 200 at terminal T1, and current source 226 conducting return current I_RET under the control of amplifier 250, which receives a common mode reference voltage (VCM) from reference circuit 252 at its negative input, and the voltages VH+, VH− from terminals T2, T4, respectively, at its positive inputs. As described above relative to FIG. 1, amplifier 250 regulates the return current I_RET to maintain the common mode voltage (e.g., average or midpoint voltage) between VH+ and VH− substantially at common mode reference voltage VCM. Output amplifier and other circuitry such as that shown in FIG. 1 will also be provided but is not shown in FIG. 2C for clarity.

In physically realizing Hall element 200 in an integrated circuit conventionally constructed shown in FIG. 2A and FIG. 2B, however, certain regions of the structure are biased to provide diode isolation of regions in Hall element, and to avoid the forward-biasing of certain p-n junctions that would render the structure inoperable. Referring to FIG. 2A, the p-n junction between p-type layer 206p and n-type well 210n and the p-n junction between p+ layer 214p and n-type well 210n (considered together with shallow n-wells 212n) should not be forward-biased. These junctions are indicated in FIG. 2A by diodes 270. This requires application of a voltage at p-type layer 206p and p+ layer 214p that is less than the diode threshold voltage above the voltage at n-type well 210n. According to the structure of FIG. 2A in the circuit arrangement of FIG. 2C, terminal BN is coupled to ground, and this ground connection is also made to p-type layer 206p through metal conductors 234, vias 237, metal conductors 236, and contacts 233 to shallow p-well 216p. Terminal BN at ground is also coupled to p+ layer 214p through one or more top-side contacts as described above, maintaining the p-n junction between buried n-type layer 204n and p-type layer 206p reverse-biased.

As evident from the circuit diagram of FIG. 2C, the lowest potential terminal of Hall element 200 is terminal T3. The regulation of return current I_RET by amplifier 250 will, in practice, keep the voltage at terminal T3 and thus n-type well 210n above ground. This reverse-biases the p-n junctions between p-type layer 206p and n-type well 210n, and between p+ layer 214p and n-type well 210n.

It has been discovered in connection with one or more embodiments, however, that Hall effect sensors incorporating conventional common mode regulation circuitry such as that shown in FIG. 1 and FIG. 2C, and such as that described in the above-incorporated U.S. Pat. No. 9,013,167, can be vulnerable to unintended increases in magnetic gain and undesired offset over manufacturing and temperature variations. More specifically, conventional common mode feedback regulation in the Hall effect sensor results in modulation of the terminal voltages of the Hall element. This voltage modulation causes variations in the width of the depletion region in the active layer of the Hall element, which are reflected in undesirable variation in the magnetic gain and offset of the Hall effect sensor.

Referring to FIG. 2C, the regulation of return current I_RET by amplifier 250 effectively "floats" terminals T1 and T3, such that the voltages at those terminals will vary as current I_RET is modulated by the common mode feedback. For example, if current I_RET is increased at current source 226 by the action of amplifier 250, the voltage at terminal T3 will be pulled closer to ground; conversely, if current I_RET is decreased by amplifier 250, the voltage at terminal T3 will increase. These variations in the voltage at terminal T3 relative to the ground level at terminal BN cause corresponding variations in the reverse-bias voltage across the p-n junction represented by diode 270.

Figure 2D:
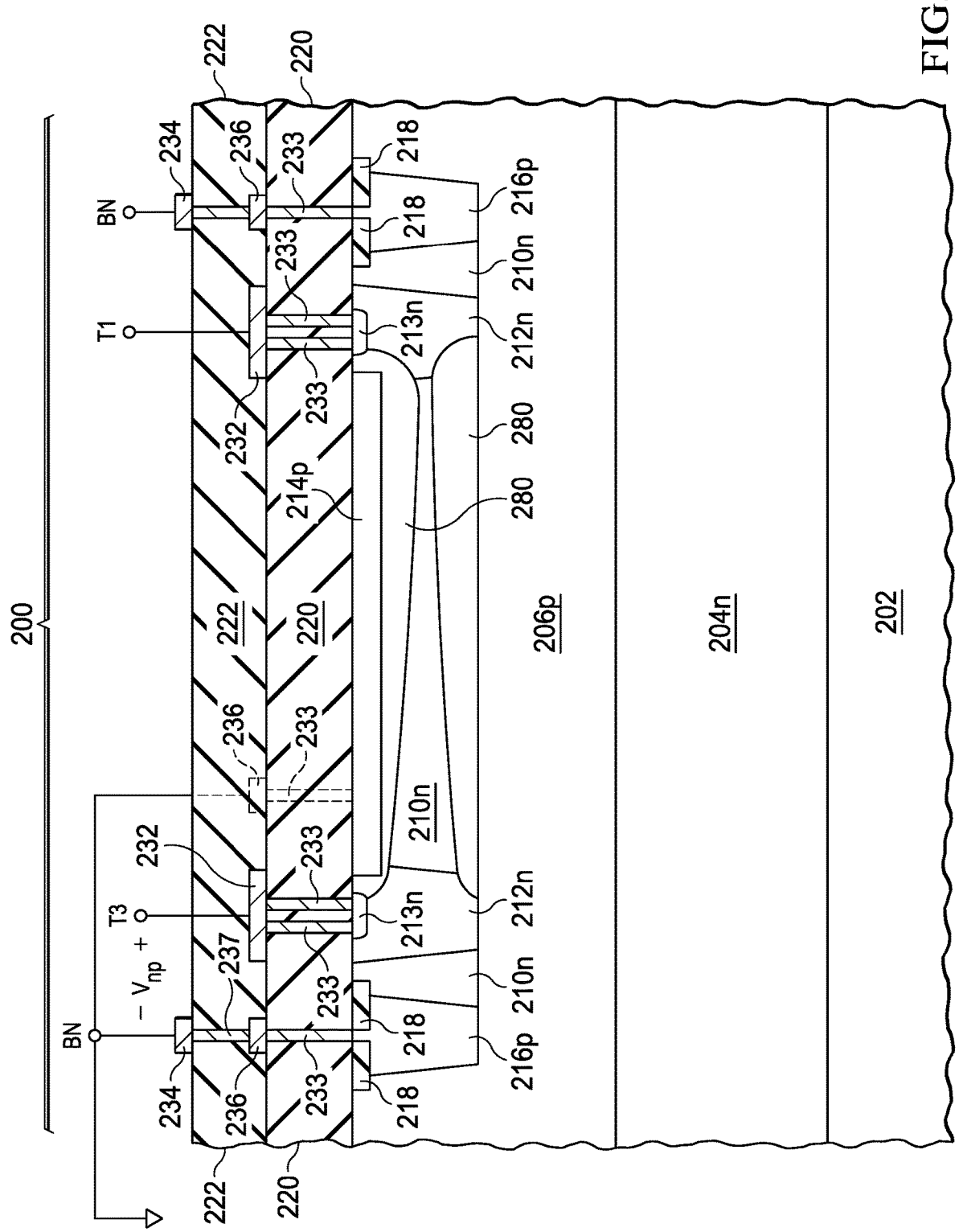
FIG. 2D is a cross-sectional diagram of the integrated circuit structure of FIG. 2A illustrating depletion regions in the structure when in operation.

These variations in the reverse-bias voltage of diode 270 are manifest as variations in the depletion regions on either side of the p-n junction between n-type well 210n and the surrounding p-type regions of layer 206p and layer 214p. FIG. 2D illustrates the cross-section of Hall element 200 as shown in FIG. 2A, but including portions of depletion regions 280 extending into n-type well 210n for a given reverse-bias voltage $V_{np}$ between terminal T3 and terminal BN at ground. While not shown in FIG. 2D, these depletion regions 280 will also extend into the p-type material of p+ layer 214p and p-type layer 206p. The relative extent to which depletion regions 280 extend into the p-type and n-type material on either side of the junction will depend on the relative dopant concentration of the two materials, with the depletion region being larger on the more lightly-doped side of the junction to attain charge balance. In the example of FIG. 2D, the majority of the upper instance of depletion region 280 will extend into n-type well 210n due to the heavy dopant concentration of p+ layer 214p. Depletion regions 280 will tend to be larger nearer terminal T1, which is at a higher potential than terminal T3. In any case, the particular depth and size of depletion regions 280 extending into n-type well 210n will depend on dopant profiles and the potential gradient.

Depletion regions 280 narrow the portion of n-well 210n that has free carriers and is thus available to conduct current, which increases the resistance between terminals T1 and T3. This resistance is voltage-dependent because the depth of depletion regions 280 depends on the voltages at terminals T1 and T3 relative to node BN, exhibiting a characteristic similar to that of a junction field-effect transistor (JFET). As described above, because terminal T3 in the circuit arrangement of Hall effect sensor 210 effectively floats with regulation of the return current I_RET, the voltage at terminal T3 will vary relative to the voltage at terminal BN, which is held at ground. Due to the JFET effect of the conduction channel in n-type well 210n, this variation in the voltage between terminal T3 and terminal BN will be reflected in variations in the resistance of Hall element 200, and thus varying offset in Hall effect sensor 210.

It has been observed, in connection with the example embodiments described below, that the JFET effect tends to be even larger in Hall effect sensors with common mode feedback regulation implemented in the manner described the above-incorporated U.S. Pat. No. 9,013,167.

Figure 3B:
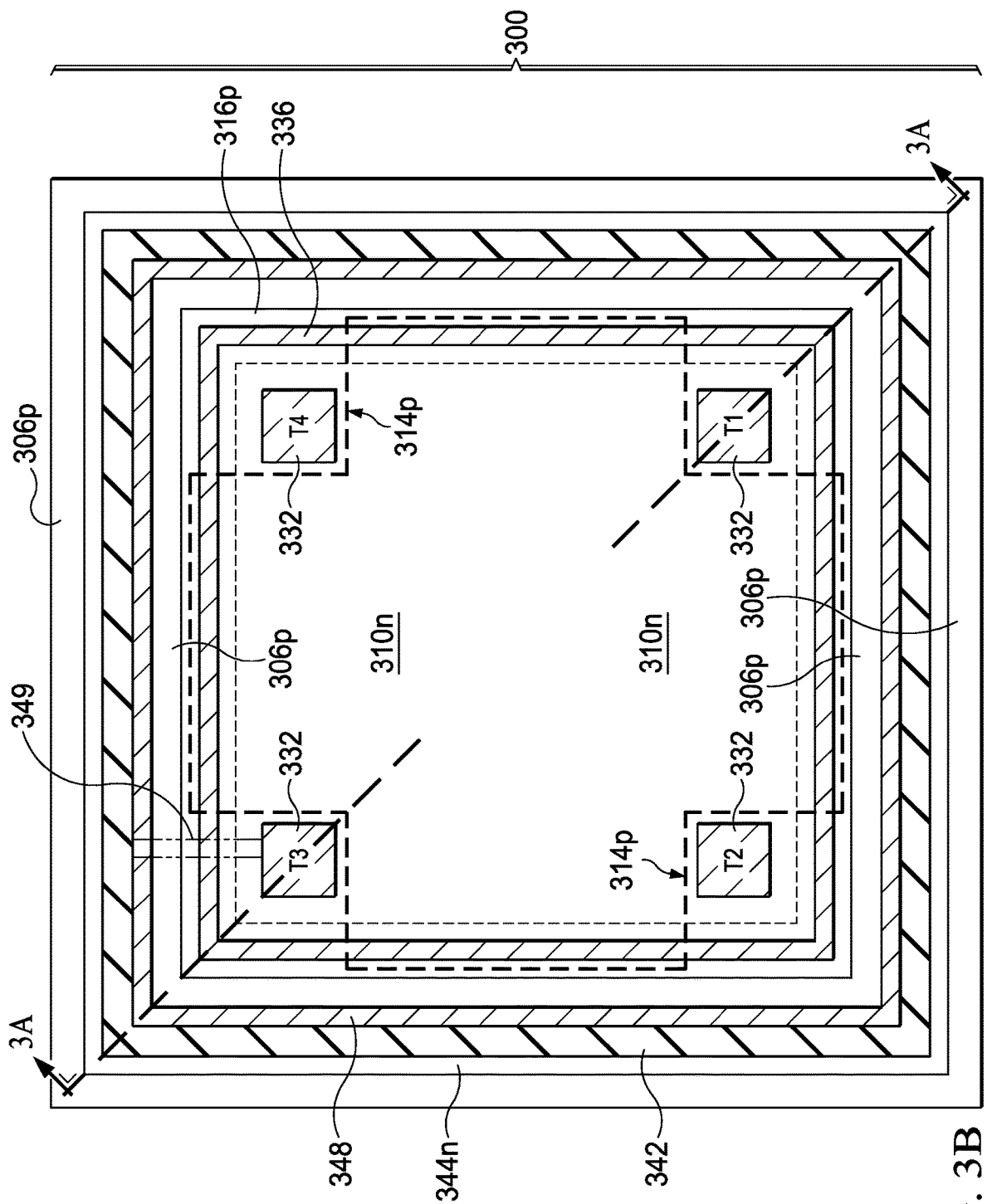
FIG. 3B is a plan view diagram of the integrated circuit structure of FIG. 3A constructed according to an example embodiment.

FIG. 3A and FIG. 3B illustrate the construction of a Hall element 300 according to an example embodiment. As evident from FIG. 3A and FIG. 3B, much of Hall element 300 is similar to that described above relative to FIG. 2A and FIG. 2B. As shown in the cross-section of FIG. 3A, Hall element 300 is constructed at a surface of a body of semiconductor (e.g., silicon) material. In this example, substrate 302 is formed of single-crystal silicon, for example doped p-type. Alternatively, substrate 302 may correspond to a single crystal silicon layer in a silicon-on-insulator (or semiconductor-on-insulator) technology, the single crystal layer disposed over an insulating layer (e.g., a buried silicon dioxide layer) supported by a semiconductor substrate. P-type layer 306p is disposed at a surface of substrate 302, and in this example includes single-crystal epitaxial silicon doped to a p-type conductivity. P-type layer 306p may be doped p-type in situ during epitaxial formation, or be formed by ion implantation, or both, in which case p-type layer 306p may consist of or include one or more buried p-type layers or wells. As such, the dopant profile of p-type layer 306p may vary with depth. N-type buried layer 304n is disposed between substrate 302 and p-type layer 306p to serve as a buried n-type region in Hall element 300. N-type buried layer 304n may be formed by ion implantation into the top surface of semiconductor substrate 302 prior to the formation of the epitaxial layer; in-situ doping of the epitaxial layer (e.g., doping n-type for a period of epitaxial growth followed by undoped or p-type doping during a following period of epitaxial growth) and/or ion implantation into the epitaxial layer that is used to form p-type layer 306p. N-type well 310n is disposed at selected locations of the surface of p-type epitaxial layer 306p, such that p-type layer 306p abuts n-type well 310n and forms a p-n metallurgical junction. In this example, n-type well 310n serves as the active layer of Hall element 300 in its measurement of an external magnetic field. In this example, n-type well 310n may be formed by masked ion implantation. P+ layer 314p is disposed at a surface of n-type well 310n in Hall element 300 and may be formed by masked ion implantation or another surface doping technique. P+ layer 314p may have a relatively heavy dopant concentration, such as that used in source and drain regions of p-channel MOS transistors elsewhere in the integrated circuit. Alternatively, an insulating layer, such as silicon dioxide or silicon nitride, may be provided in place of p+ layer 314p at the surface of n-type well 310n. In some example embodiments, the top surface of p+ layer 314p may be silicided.

Shallow n-type wells 312n are disposed at selected locations within n-type well 310n, formed for example by ion implantation or deposition. N+ regions 313n are disposed at locations of the surface of shallow n-type wells 312n to enable good ohmic contact with overlying metal conductors. In some example embodiments, a silicide is formed on the upper surface of N+ regions 313n. One or more shallow p-type wells 316p are disposed along the boundary of n-type well 310n and may also be formed by way of ion implantation or deposition. A p+ region and/or a silicide may be formed at the upper surface of p-type wells 316p. In this example, isolation structures 318 (e.g., comprised of an oxide, a nitride, an oxynitride or other insulating material) are disposed at the surface of shallow p-type wells 316p, and in this example may be formed by way of shallow trench isolation, local oxidation of silicon (LOCOS) processes, or the like.

One or more insulating layers 320, 322 are disposed over the surface of the structure. Insulating layers 320, 322 may be formed of one or more layers of silicon dioxide, silicon nitride, low-k material, or another insulating material, formed by chemical vapor deposition or the like. Electrical connection to various structures of Hall element 300 is made through these overlying insulating layers 320, 322. As shown in FIG. 3A, metal conductors 332 are disposed at selected locations of the surface of lower insulating layer 320 (where, for example, conductors 332 are fabricated using a metal that may be etched, like aluminum, tungsten, titanium and/or aluminum doped with copper) or they may be disposed within insulating layer 320 (where, for example, the conductors 332 are fabricated using copper and a damascene process is used to form the conductive structures). Metal conductors 332 contact corresponding instances of shallow n-well 312n by way of contacts 333 (fabricated, for example, using one or more layers of tungsten, titanium, aluminum, copper and/or a mixture of the aforementioned with nitrogen) extending through insulating layer 320 to n+ regions 313n at the surface of shallow n-well instances 312n. Similarly, metal conductors 334 are in electrical contact with corresponding metal conductors 336 by way of vias 337 through insulating layer 322. Metal conductors 334 are in turn in electrical contact with shallow p-wells 316p by way of corresponding contacts 333 through insulating layer 320 to electrically contact shallow p-wells 316p at locations between shallow isolation structures 318 as shown in FIG. 3A. P+ regions (not shown) may be provided at the contact locations of shallow p-wells 316p if desired. Conductors 334, 336, 346, and 348 may be fabricated using the same materials and/or processing techniques as used for conductors 332, and vias 337 and 347 may be fabricated using the same materials and/or processing techniques as contacts 333.

According to this example embodiment, trench isolation structures 342 are disposed into the surface of the integrated circuit to isolate p-type layer 306p within Hall element 300 from surrounding p-type material in other portions of the integrated circuit. As shown in FIG. 3A, trench isolation structures 342 include one or more layers of an insulating material, such as deposited silicon dioxide, deposited silicon nitride, another insulating material, or a combination of insulating material types. These trench isolation structures 342 extend into the surface to at least a depth sufficient to reach buried n-type layer 304n and may fully extend through buried n-type layer 304n into substrate 302 as shown in FIG. 3A. In this example, an n-type region 344n surrounds each trench isolation structure 342, extending to at least the depth of buried n-type layer 304n. Shallow trench isolation structures 318 may be disposed at the surface of trench isolation structure 342 and portions of n-type region 344n as desired. N-type regions 344n may be formed by ion implantation (either after the trench is formed for trench isolation 342 but prior to filing the trench with insulating material or after the trench is formed and filled with isolating materials) or by out-diffusing dopant from the isolating material used to form trench isolation 342.

Examples of semiconductor processes that may be used to form trench isolation structures 342 in this example embodiment are described in U.S. Pat. Nos. 5,468,676; 6,667,226; 9,076,863; and 5,106,777, each of which is commonly assigned herewith and is incorporated herein by this reference.

Electrical contact to n-type regions 344n may be made from the surface, for example by way of one or more metal conductors 346 at the surface of insulating layer 322. Electrical connection from metal conductors 346 to n-type regions 344n may be made through corresponding vias 347 extending through insulating layer 322 to metal conductors 348, and from conductors 348 through corresponding contacts 333 extending through insulating layer 320 to n-type region 344n. Contacts 333 may, for example, make contact by way of a n+ diffused region (not shown) and/or silicide region (not shown) at the surface of n-type region 344n if desired. To ensure reverse bias of the p-n junction between n-type region 344n and p-type layer 306p, a positive voltage V+ (e.g., power supply voltage VS) is applied at metal conductor 346 in this example. This positive reverse-bias voltage may alternatively be applied to n-type region 344n at other locations or in other ways. In the example of FIG. 3A, this same positive voltage will also effectively bias buried n-type layer 304n, thus reverse-biasing the p-n junction between it and p-type layer 306p. Bias at ground or another low potential is also applied to substrate 302 to ensure reverse-bias of the p-n junction between substrate 302 and buried n-type layer 304n.

In an alternative implementation, trench isolation structures 342 include polycrystalline silicon. For example, trench isolation structures 342 may be initially filled with silicon dioxide or another insulating material, which is then etched through and refilled with polysilicon, in this example doped p-type, extending to a depth sufficient to be in contact with p-type substrate 302 at the bottom of the trench. Some oxide may remain on the trench sidewalls after this etching. An additional contact may be made to the surface of polysilicon trench isolation structures 342 to receive a ground or other bias voltage to reverse-bias the p-n junction between substrate 302 and buried n-type layer 304n. In any case, whether filled with an insulating material or with p-type silicon biased to ground or a low voltage, for example, trench isolation structures 342 isolate p-type layer 306p within the body of the integrated circuit, enabling the potential of p-type layer 306p at terminal BN to be coupled to the lowest potential terminal of Hall element 300, namely terminal T3 in this example.

FIG. 3B illustrates Hall element 300 in plan view, at a point in its fabrication before the deposition of insulating layer 322, and with insulating layer 320 not visible for clarity. As evident from FIG. 3B, Hall element 300 in this example has a square shape, with conductors 332 disposed near its four corners. Each of these four conductors 332 are in contact with n-type well 310n through corresponding instances of shallow n-well 312n disposed at the locations of conductors 332, as shown in FIG. 3A. The cross-section of FIG. 3A is taken along a diagonal through two of metal conductors 332, namely those corresponding to terminals T1 and T3, which are at opposite corners of Hall element 300. The metal conductors 332 corresponding to terminals T2 and T4 are at the other two corners of Hall element 300, and as such are not collinear with terminals T1 and T3. Terminals T1 through T4 of Hall element 300 in this example are thus arranged to detect magnetic fields oriented in a direction normal to the surface of Hall element 300 and the integrated circuit in which Hall element 300 is realized.

While Hall element 300 in this example has a square shape as shown in FIG. 3B, Hall element 300 may be constructed according to other shapes. For example, Hall element 300 may be constructed in a cross shape, as described in above-incorporated U.S. Pat. No. 9,013,167. Other shapes of Hall elements are also contemplated.

In this example of FIG. 3B, metal conductor 336 and shallow p-type well 316p encircle n-type well 310n. P+ layer 314p, illustrated by dashed lines in FIG. 3B, extends over much of the surface of n-type well 210n and overlaps shallow p-type well 316p. Multiple contacts 333 underlying metal conductor 336 and in contact underlying regions, including p+ layer 314p and shallow p-type well 316p, may also be present at selected locations but are not visible in FIG. 3B. According to this example embodiment, trench isolation structures 342 and n-type regions 344n surround the perimeter of Hall element 300, isolating the portion of p-type layer 306p within Hall element 300 from portions of that same p-type layer 306p in adjacent Hall elements 300 or elsewhere in the integrated circuit. Further, the positive voltage V+ (e.g., power supply voltage VS) applied to n-type region 344n and buried n-type layer 304n reverse-biases the p-n junction between those n-type regions and p-type layer 306p.

Figure 4:
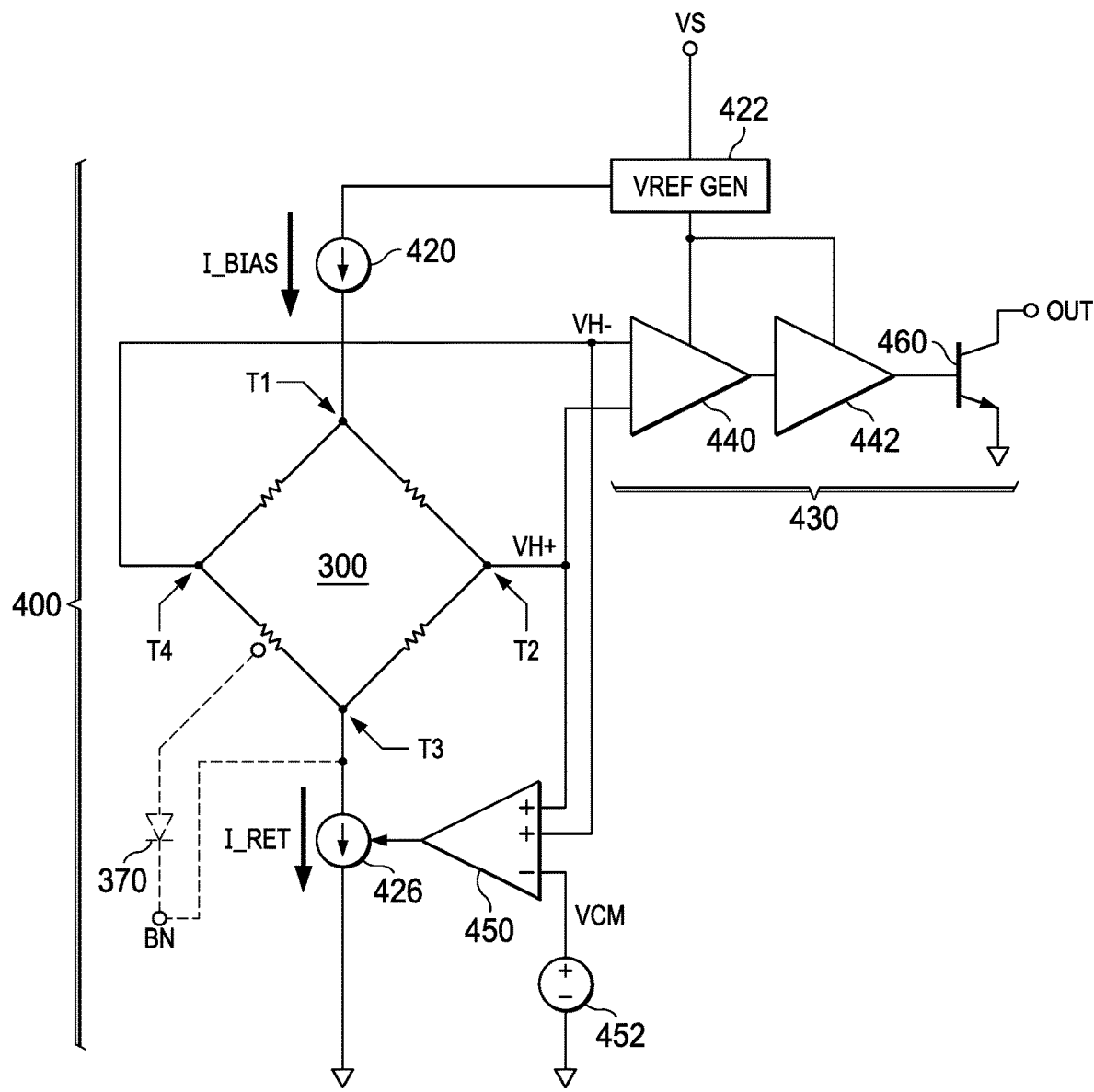
FIG. 4 is an electrical diagram, in schematic form, of a Hall effect sensor incorporating the Hall element of FIG. 3A and FIG. 3B according to an example embodiment.

FIG. 4 is a schematic diagram illustrating the electrical arrangement of Hall effect sensor 400 with common mode feedback including Hall element 300 according to this example embodiment, in which the effect of the isolation of p-type layer 306p by trench isolation structures 342 may be attained. Hall element 300 of FIG. 3A and 3B is represented in FIG. 4 by the equivalent circuit of a Wheatstone bridge with four resistors arranged among four terminals T1 through T4, each terminal corresponding to one of the four metal conductors 332 of FIG. 3B. Current source 420 is coupled to terminal T1 and conducts bias current I_BIAS into Hall element 300 at that terminal T1. Current source 420 may be realized as a transistor (e.g., a p-channel or n-channel metal-oxide-semiconductor transistor (pMOS or nMOS, respectively), bipolar junction transistor, JFET, etc.), a current mirror, or the like. In this example, current source 420 is biased from a reference voltage generated by reference voltage generator 422, which may be constructed as a bandgap reference circuit or other regulated voltage generator circuit, and in this example is biased from external power supply voltage VS. As such, bias current I_BIAS is intended as a fixed bias current applied to Hall element 300. Current source 426 is coupled to conduct return current I_RET between the lowest potential terminal of Hall element 300, which is terminal T3 in this arrangement, and circuit ground node, under the control of regulating amplifier 450, which has an output coupled to a control terminal of current source 426. Current source 426 may be realized as a transistor (e.g., a pMOS or nMOS transistor, bipolar junction transistor, JFET, etc.), as a current mirror, or as another circuit suitable for providing regulated return current I_RET under the control of amplifier 450.

The Lorentz force resulting from impingement of an external magnetic field normal to the surface of Hall element 300 induces a Hall effect current in a direction orthogonal to the cross-section of FIG. 3A (i.e., a current running into or out of the page). This current is reflected in a voltage differential across terminals T2 and T4 of Hall element 300, and that voltage differential is coupled as voltages VH+ and VH− to output circuitry 430 of Hall effect sensor 400. In this example embodiment, output circuitry 430 includes differential amplifier 440 with differential inputs coupled to receive voltages VH+ and VH− from terminals T2 and T4, respectively. The output of differential amplifier 440 is coupled to an input of output driver 442, which may be realized as a Schmitt trigger or the like. Amplifier 440 and output driver 442 may be biased from reference voltage generator 422 as shown in FIG. 4. In this example embodiment, output transistor 460 is realized as a bipolar transistor arranged as an open collector amplifier, with its emitter at ground and its base coupled to output driver 442, although a MOS transistor or JFET may alternatively be used as output transistor 460. In operation, output transistor 460 presents a binary signal at its output node OUT in response to the Hall effect current induced in Hall sensor 300. For example, the binary output signal may be indicative of whether Hall element 300 is in a magnetic field in the direction normal to the surface of the integrated circuit and of a magnitude greater than some threshold level.

As mentioned above, current source 426 in Hall effect sensor 400 is controlled by regulating amplifier 450. In this example embodiment, amplifier 450 receives common mode reference voltage VCM from reference circuit 452 at its negative input, and receives voltages VH+, VH− from terminals T2, T4, respectively, at its positive inputs. The output of amplifier 450 is coupled to a control terminal of current source 426. For an example in which current source 426 is realized as a MOS transistor, the output of amplifier 450 may be coupled to the gate of that MOS transistor.

The electrical characteristics of Hall effect sensor 400 may vary with the operating temperature of the integrated circuit. As mentioned above, the resistivity of Hall element 300 itself increases with temperature. In addition, while current source 420 in this example is intended to provide a fixed bias current I_BIAS, bias current I_BIAS may vary with temperature as the electrical characteristics (e.g., resistivity of a reference polysilicon resistor) of current source 420 and reference voltage generator 422 vary with temperature. Manufacturing imperfections and variations can also cause deviations in bias current I_BIAS from its intended level. In operation, amplifier 450 regulates the return current I_RET conducted by current source 426 to match bias current I_BIAS and satisfy Kirchoff's current law (KCL), even as bias current I_BIAS may vary over temperature or manufacturing variations. In this example, amplifier 450 regulates return current I_RET in order to maintain the common mode voltage (e.g., average or midpoint voltage) between voltages VH+ and VH− at terminals T2 and T4, respectively, at the common mode reference voltage VCM. This regulation of return current I_RET by amplifier 450 effectively "floats" terminals T1 and T3, such that the voltages at those terminals adjust as return current I_RET is modulated by the common mode feedback to match bias current I_BIAS. For example, if current I_RET is increased at current source 426 to match bias current I_BIAS by the action of amplifier 450, the voltage at terminal T3 will be pulled closer to ground to satisfy KCL; conversely, if current I_RET is decreased by amplifier 450, the voltage at terminal T3 will increase.

In the alternative to the common mode feedback regulation of return current I_RET as described above, other common mode feedback regulation techniques may instead be implemented in Hall effect sensor 400 according to this example embodiment. For example, common mode feedback regulation may be implemented in Hall effect sensor 400 in the manner described in the above-incorporated U.S. Pat. No. 9,013,167, which directly regulates the lower potential bias terminal voltage (e.g., terminal T3). It is contemplated that these and other common mode feedback regulation approaches may be incorporated into a Hall effect sensor constructed and operating according to the example embodiments described in this specification.

The isolation of p-type layer 306$p$ provided by deep trench isolation structures 342 enables p-type layer 306$p$ to be coupled to a potential other than ground or such other voltage applied to that layer elsewhere in the same integrated circuit. This isolation is used to advantage in Hall effect sensor 400 according to this example embodiment by enabling the coupling of terminal BN corresponding to the p-type layer 306$p$ and at the anode of diode 370 to the lowest potential terminal of Hall element 300, which in this example is terminal T3. This connection is shown in the structure of FIG. 3A and FIG. 3B by metal conductor 349 making a topside connection from metal conductor 334 in electrical contact with shallow p-type well 316$p$ and thus p-type layer 306$p$, to metal conductors 339 and 332, which are in electrical contact with shallow n-type well 313$n$ and n-type well 310$n$. In addition, because p+ layer 314$p$ is coupled to metal conductor 336 and thus terminal BN, as shown in FIG. 3B, terminal T3 is also coupled to p+ layer 314$p$. In this example, the coupling of terminal BN to terminal T3 in Hall effect sensor 400 is a direct connection, such that terminal BN is at the same potential as terminal T3. This 0v differential across the p-n junction between n-type well 310$n$ and p-type layers 306$p$, 314$p$ is below the diode threshold voltage of diode 370 and thus does not forward-bias of that junction.

By coupling of terminal BN to the lowest potential terminal of Hall element 300, namely terminal T3 in the example of FIG. 4, the potential of p-type layers 306$p$, 314$p$ float with the potential of n-type layer 310$n$, at terminal T3, as amplifier 450 regulates return current I_RET. To the extent that depletion regions in n-type well 310$n$ are present near the shallow n-well 313$n$ coupled to terminal T3 in this reverse-biased situation, the depth of those depletion regions into n-type well 310$n$ will remain substantially constant even as the potential of terminal T3 modulates with the common mode feedback regulation applied by amplifier 450. This coupling of terminal T3 to terminal BN according to this example embodiment thus eliminates variation in resistance of the Hall element from the JFET effect as return current I_RET is modulated over variations in temperature and manufacturing parameters. Variability in the magnetic gain and offset of Hall effect sensor 400 due to this cause is thus reduced if not eliminated.

It is contemplated that Hall element 300 and Hall effect sensor 400 according to this example embodiment may be implemented in various alternative arrangements. In one example of such an alternative, a Hall effect sensor may incorporate an array of Hall elements, for example four Hall elements 300, with terminals interconnected (e.g., all terminals T1 connected together, all terminals T2 connected together, etc.), but with the position of terminals T1 through T4 spatially rotated relative to one another within the array. This spatial rotation serves to reduce offset due to mechanical stress and variability in patterning and other fabrication parameters. In some implementations, the output and bias terminals of the elements are interchanged over a series of measurements, for example in a "spinning-current" manner (referring to the direction of bias current through the sensors) or a chopping-stabilized sequence, with the results averaged so that offset is canceled out. In this alternative example embodiment, a trench isolation structure may surround each Hall element in the array, in the manner described above, with the isolated p-type layer underlying the n-type Hall layer coupled to the lowest potential terminal of the Hall element for each measurement. For example, the isolated p-type layer may be coupled to a terminal of the current source, so that the isolated p-type layer is always coupled to the lowest potential terminal regardless of the switching among the terminals.

In another alternative example embodiment, the conductivity types of the various layers and regions in Hall element 300 described above may be reversed, such that p-type regions shown in FIG. 3B are instead n-type, and vice versa. In this alternative implementation, the active layer in which the Hall effect is measured will be a p-type well rather than n-type well 310n as shown. It is contemplated, however, that n-type material such as n-type well 310n will exhibit higher carrier mobility, and thus potentially a larger measurable voltage for a given magnetic field magnitude, than would p-type material in this alternative arrangement.

While Hall element 300 described above is oriented to detect and measure magnetic fields normal to the surface of the integrated circuit, aspects of the described example embodiments may also be incorporated into an integrated "vertical" Hall element capable of detecting and measuring a magnetic field in a direction coplanar with the surface of the integrated circuit. A description of the construction and operation of a conventional vertical Hall element and Hall effect sensor incorporating that vertical Hall element is described in commonly assigned U.S. Pat. No. 10,553,784, incorporated herein by this reference.

Referring now to FIG. 5, the construction of vertical Hall element 500 according to an alternative example embodiment will be described. In this example, Hall element 500 may be constructed in the same integrated circuit as Hall element 300 described above, and as such many of the same structures described above in connection with FIG. 3A may be similarly incorporated into vertical Hall element 500. Those same structures will be referred to in this description and in FIG. 5 using the same reference numbers as in FIG. 3A.

The structures of vertical Hall element 500 in this example embodiment that are also present in Hall element 300 of FIG. 3A and FIG. 3B may be formed in the same manner as described above in connection with Hall element 300. One or more changes in the formation and arrangement may be desirable for vertical Hall element 500 in some implementations, however. As described above, p-type layer 306p is formed at the surface of substrate 302 of single-crystal epitaxial silicon doped to a p-type conductivity. As mentioned above relative to FIG. 3A, p-type layer 306p may be implanted with p-type dopant (e.g., boron) to form one or more buried p-type layers or wells according to the intended dopant profile. If so, some or all of these deep boron ion implants may be masked from the location of vertical Hall element 500, such that p-type layer 306p in this region of vertical Hall element 500 may be more uniformly and lightly doped p-type than in Hall element 300. N-type well 310n is disposed at selected locations of the surface of p-type layer 306p, such that p-type layer 306p abuts n-type well 310n and forms a p-n metallurgical junction. In this example, n-type well 310n serves as the active layer of Hall element 300 in its measurement of an external magnetic field. While FIG. 5 does not show (for clarity) overlying insulator layer 322 and the various metal conductors and vias at the surface of and through that insulator layer 322 as shown in FIG. 3A, it is contemplated that such overlying insulator and conductor layers will also be incorporated into Hall element 500 to arrange its interconnection into a Hall effect sensor and other circuitry, as described above.

Vertical Hall element 500 according to this example embodiment may be implemented into Hall effect sensor 400 as described above relative to FIG. 4, for the detection and measurement of a magnetic field in a direction coplanar with the integrated circuit. As such, vertical Hall element 500 similarly has four terminals T1, T2, T3, T4. The cross-section of FIG. 5 shows all of the terminals T1, T2, T3, T4, as realized by way of metal conductors 332 that are coupled to n-type well 310n by way of corresponding contacts 333 through insulating layer 320 that electrically contact corresponding n+ regions 313n at n-type well 310n, as shown. While shallow n-type wells 313n are not present at the terminal contact locations in this example shown in FIG. 5, such n-type wells may be disposed into n-type well 310n at the locations at which terminals T1 through T4 are in contact with n-type well 310n, if desired. In this example embodiment, the contact of terminal T1 to n-type well 310n is near the center of n-type well 310n within vertical Hall element 500, and two contacts for terminal T3 are on opposite sides of terminal T1 and near the perimeter of n-type well 310n within Hall element 500. Terminal T2 contacts n-type well 310n between the contacts for terminal T1 and terminal T3 on one side, and terminal T4 contacts n-type well 310n between the contacts for terminal T1 and terminal T3 on the other side. As such, terminals T2 and T4 are generally collinear with terminals T1 and T3, such that vertical Hall element 500 is oriented to detect magnetic fields in a direction coplanar with the surface of vertical Hall element 500 and perpendicular to the line of terminals T1, T2, T3, T4. The above incorporated U.S. Pat. No. 10,553,784 provides further description of the arrangement of terminals in a vertical Hall element, as may be used in the implementation of Hall element 500 according to this example embodiment.

Hall effect sensor 400 of FIG. 4 operates electrically in a similar fashion when including vertical Hall element 500, with bias current I_BIAS sourced into terminal T1 and return current I_RET conducted from both terminals T3. As shown in FIG. 5, current is conducted through n-type well 310n in both directions from centrally located terminal T1 to terminals T3 located on either side, with approximately one-half of the current conducting toward the left-hand instance of terminal T3 (current I_LEFT) and the other approximately one-half of the current conducting toward the right-hand instance of terminal T3 (current I_RIGHT). In the presence of a magnetic field B in a direction coplanar with the surface of Hall element 500, the Lorentz force on the current conducted orthogonal to the magnetic field will, in this case, cause electrons to move upward toward the surface or downward toward away from the surface, depending on the direction of the current. For the example of FIG. 5 in which a magnetic field B in the direction out of the page is impinging Hall element 500, the Lorentz force causes electrons in the current component I_LEFT to move upward toward the surface, toward terminal T4 and inducing a negative voltage VH− at that terminal T4. Conversely, the Lorentz force causes electrons in the current component I_RIGHT to move away from the surface, inducing a positive voltage VH+ at that terminal T2. Accordingly, a differential voltage will appear across terminals T2 and T4 in the presence of this magnetic field, and may be amplified by output circuitry 430 as described above.

According to this example embodiment, and similarly as in Hall element 300 described above, trench isolation structures 342 are disposed into the surface of the integrated circuit to isolate p-type layer 306p within Hall element 500 from surrounding p-type material in other portions of the integrated circuit. As described above, trench isolation structures 342 include an insulating material, such as deposited silicon dioxide, deposited silicon nitride, another insulating material, or a combination of insulating material types. Trench isolation structures 342 may be formed in the manner described in the above-incorporated U.S. Patents, extending into the surface to a depth at least that of buried n-type layer 304n, and may fully extend through buried n-type layer 304n into substrate 302 as shown in FIG. 5. In this example, n-type regions 344n surrounds each trench isolation structure 342, extending to at least a depth that reaches buried n-type layer 304n as shown. Shallow trench isolation structures 318 may be disposed at the surface of trench isolation structure 342 and portions of n-type region 344n as desired, and a positive voltage V+ (e.g., power supply voltage VS) may be applied to n-type regions 344n to reverse-bias its p-n junction (and that of buried n-type layer 304n) with p-type layer 306p.

Similarly as described above, this isolation of p-type layer 306p in Hall element 500 according to this example embodiment enables p-type layer 306p (via terminal BN) to be coupled to the lowest potential terminal of Hall element 500, which in this example is terminal T3, for example by a topside connection as described above. Similar coupling of terminal T3 and terminal BN to each instance of p+ layer 314p may be made as also described above. In this example, the direct connection of terminal BN to terminal T3 in Hall element 500 places terminal BN at the same potential as terminal T3. The voltage across the p-n junction between p-type layer 306p and n-type well 310n is thus kept below the diode threshold voltage.

As before, this coupling of terminal BN to the lowest potential terminal of Hall element 500, namely terminal T3, the potential of p-type layers 306p, 314p float with the potential of n-type layer 310n at terminal T3, as amplifier 450 of Hall effect sensor 400 regulates return current I_RET. Variation in the resistance of the Hall element 500 from the JFET effect as return current I_RET is regulated over variations in temperature and manufacturing parameters, is thus avoided, reducing corresponding variations in magnetic gain and offset.

As noted above, vertical Hall element 500 may be fabricated into the same integrated circuit as Hall element 300. Fabrication into the same integrated circuit of two such instances of vertical Hall element 500 oriented perpendicularly relative to one another, along with an instance of horizontal Hall element 300 described above, can thus provide a three-dimensional magnetic field sensor with reduced variability in magnetic gain and offset over temperature and manufacturing variations.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. A Hall effect sensor, comprising:
a Hall element disposed at a surface of a semiconductor body and comprising:
a first doped region of a first conductivity type;
a second doped region of a second conductivity type, disposed under and abutting the first doped region, and electrically isolated within the semiconductor body;
first, second, third, and fourth terminals in electrical contact with the first doped region at separate locations of the surface;
a fifth terminal in electrical contact with the second doped region;

a first current source coupled to the first terminal of the Hall element;

common mode feedback regulation circuitry, having an input coupled to the second and fourth terminals of the Hall element, and an output coupled to the third terminal and a ground node; and output circuitry coupled to the second and fourth terminals of the Hall element;

wherein the third terminal of the Hall element is coupled to the fifth terminal.

2. The Hall effect sensor of claim 1, wherein the common mode feedback regulation circuitry comprises:

a voltage reference circuit, having an output presenting a common mode reference voltage;

a second current source, coupled between the third terminal and the ground node; and a regulating amplifier, having an input coupled to the second and fourth terminals of the Hall element, an input coupled to the output of the voltage reference circuit, and an output coupled to a control terminal of the second current source.

3. The Hall effect sensor of claim 1, wherein the Hall element further comprises:

a buried doped region of the first conductivity type, disposed under and abutting the second doped region; and a trench isolation structure extending from the surface of the semiconductor body to a depth at least reaching the buried doped region and surrounding the second doped region.

4. The Hall effect sensor of claim 3, wherein the Hall element further comprises:

a third doped region of the first conductivity type surrounding the trench isolation structure and extending to a depth at least reaching the buried doped region.

5. The Hall effect sensor of claim 1, further comprising:

first, second, third, and fourth shallow well regions of the first conductivity type, and from the surface to a depth in contact with the first doped region;

wherein the first, second, third, and fourth terminals contact surface locations of the first, second, third, and fourth shallow well regions, respectively.

6. The Hall effect sensor of claim 5, further comprising:

a fifth shallow well region of the second conductivity type, disposed at boundaries of the first doped region and extending from the surface to a depth in contact with the second doped region;

wherein the fifth terminal contacts at least one surface location of the fifth shallow well region.

7. The Hall effect sensor of claim 1, wherein the locations of the surface from which the second and fourth terminals are in electrical contact with the first doped region are not collinear with the locations of the surface from which the first and third terminals are in electrical contact with the first doped region.

8. The Hall effect sensor of claim 1, wherein the locations of the surface from which the second and fourth terminals are in electrical contact with the first doped region are collinear with the locations of the surface from which the first and third terminals are in electrical contact with the first doped region.

9. The Hall effect sensor of claim 1, further comprising:

a fourth doped region of the second conductivity type disposed at the surface and overlying the first doped region, and in electrical contact with the fifth terminal.

10. The Hall effect sensor of claim 1, wherein the first conductivity type is n-type and the second conductivity type is p-type.

11. A Hall effect sensor comprising:

a Hall element disposed at a surface of a semiconductor body and comprising:

a first doped region of a first conductivity type;

a second doped region of a second conductivity type, disposed under and abutting the first doped region;

a buried doped region of the first conductivity type, disposed under and abutting the second doped region first, second, third, and fourth terminals in electrical contact with the first doped region;

a fifth terminal in electrical contact with the second doped region;

a trench isolation structure extending from the surface of the semiconductor body to a depth at least reaching the buried doped region and surrounding the second doped region; and a third doped region of the first conductivity type surrounding the trench isolation structure and extending to a depth at least reaching the buried doped region.

12. The Hall effect sensor of claim 11 further comprising:

first, second, third, and fourth shallow well regions of the first conductivity type, and from the surface to a depth in contact with the first doped region;

wherein the first, second, third, and fourth terminals contact surface locations of the first, second, third, and fourth shallow well regions, respectively.

13. The Hall effect sensor of claim 12 further comprising:

a fifth shallow well region of the second conductivity type, disposed at boundaries of the first doped region and extending from the surface to a depth in contact with the second doped region;

wherein the fifth terminal contacts at least one surface location of the fifth shallow well region.

14. The Hall effect sensor of claim 11, wherein locations of the surface from which the second and fourth terminals are in electrical contact with the first doped region are not collinear with the locations of the surface from which the first and third terminals are in electrical contact with the first doped region.

15. The Hall effect sensor of claim 11, wherein locations of the surface from which the second and fourth terminals are in electrical contact with the first doped region are collinear with the locations of the surface from which the first and third terminals are in electrical contact with the first doped region.

16. The Hall effect sensor of claim 11 further comprising a fourth doped region of the second conductivity type disposed at the surface and overlying the first doped region, and in electrical contact with the fifth terminal.

17. The Hall effect sensor of claim 11, wherein the first conductivity type is opposite to the second conductivity type.

18. The Hall effect sensor of claim 11 further comprising a sixth terminal in electrical contact with the third doped region, the third terminal configured to receive a bias voltage.

19. The Hall effect sensor of claim 11, wherein the third terminal is coupled to the fifth terminal, and the third terminal is lowest potential terminal of the Hall element.

20. The Hall effect sensor of claim 11 further comprising a feedback circuitry, the feedback circuitry further comprising:

a voltage reference circuit, having an output presenting a reference voltage;
a current source, coupled between the third terminal and a ground node; and
an amplifier, having an input coupled to the second and fourth terminals of the Hall element, an input coupled to the output of the voltage reference circuit, and an output coupled to a control terminal of the current source.

* * * * *